United States Patent
Ovtchinnikov et al.

(10) Patent No.: US 8,416,830 B2
(45) Date of Patent: Apr. 9, 2013

(54) WAVELENGTH STABILIZED LIGHT EMITTER AND SYSTEM FOR PROTECTING EMITTER FROM BACKREFLECTED LIGHT

(75) Inventors: Alex Ovtchinnikov, Worcester, MA (US); Alexey Komissarov, Charlton, MA (US); Nikolai Strougov, Dudley, MA (US); Vadim Chuyanov, Oxford, MA (US)

(73) Assignee: IPG Photonics Corporation, Oxford, MA (US)

( * ) Notice: Subject to any disclaimer, the term of this patent is extended or adjusted under 35 U.S.C. 154(b) by 240 days.

(21) Appl. No.: 12/315,440

(22) Filed: Dec. 3, 2008

(65) Prior Publication Data

US 2010/0135350 A1 Jun. 3, 2010

(51) Int. Cl.
*H01S 3/08* (2006.01)

(52) U.S. Cl.
USPC .............. 372/102; 372/6; 372/43.01; 372/70

(58) Field of Classification Search .......... 372/9, 14–16, 372/23, 25, 29.02–32, 39–43.01, 92–109
See application file for complete search history.

(56) References Cited

U.S. PATENT DOCUMENTS

| | | | |
|---|---|---|---|
| 4,879,722 A | 11/1989 | Dixon et al. | |
| 5,048,030 A | 9/1991 | Hiiro | |
| 5,084,880 A * | 1/1992 | Esterowitz et al. | 372/6 |
| 5,212,707 A | 5/1993 | Heidel et al. | |
| 5,418,880 A | 5/1995 | Lewis et al. | |
| 6,031,243 A * | 2/2000 | Taylor | 257/13 |
| 6,124,973 A * | 9/2000 | Du et al. | 359/618 |
| 6,141,360 A * | 10/2000 | Kinugawa et al. | 372/20 |
| 6,731,839 B2 * | 5/2004 | Bhagavatula et al. | 385/37 |
| 7,580,117 B2 * | 8/2009 | Okada et al. | 356/4.01 |
| 2003/0058904 A1 * | 3/2003 | Krainer et al. | 372/25 |
| 2004/0109484 A1 * | 6/2004 | Shinohara et al. | 372/43 |
| 2005/0036534 A1 * | 2/2005 | Baney | 372/106 |
| 2006/0098700 A1 * | 5/2006 | Alahautala et al. | 372/29.014 |
| 2007/0291373 A1 * | 12/2007 | Hu et al. | 359/641 |

* cited by examiner

*Primary Examiner* — Xinning Niu
(74) *Attorney, Agent, or Firm* — Yuri Kateshov; Timothy J. King

(57) ABSTRACT

A gain module, operative to output a laser light coupled into a laser system, is structured with at least one gain element radiating the laser light and a spectrally-selective element. The spectrally-selective element includes a slab of photosensitive material and two parallel feedback and isolating Bragg mirrors recorded in the slab. The feedback Bragg mirror is operative to provide a wavelength-dependent feedback so as to cause the laser chip to generate the laser light at the resonance wavelength of the feedback Bragg mirror. The isolating Bragg mirror is automatically adjusted to retroreflect a backreflected signal light, which is generated by the laser system at a signal wavelength different from the resonance wavelength, upon positioning the feedback mirror orthogonally to the laser light.

10 Claims, 2 Drawing Sheets

Known Art

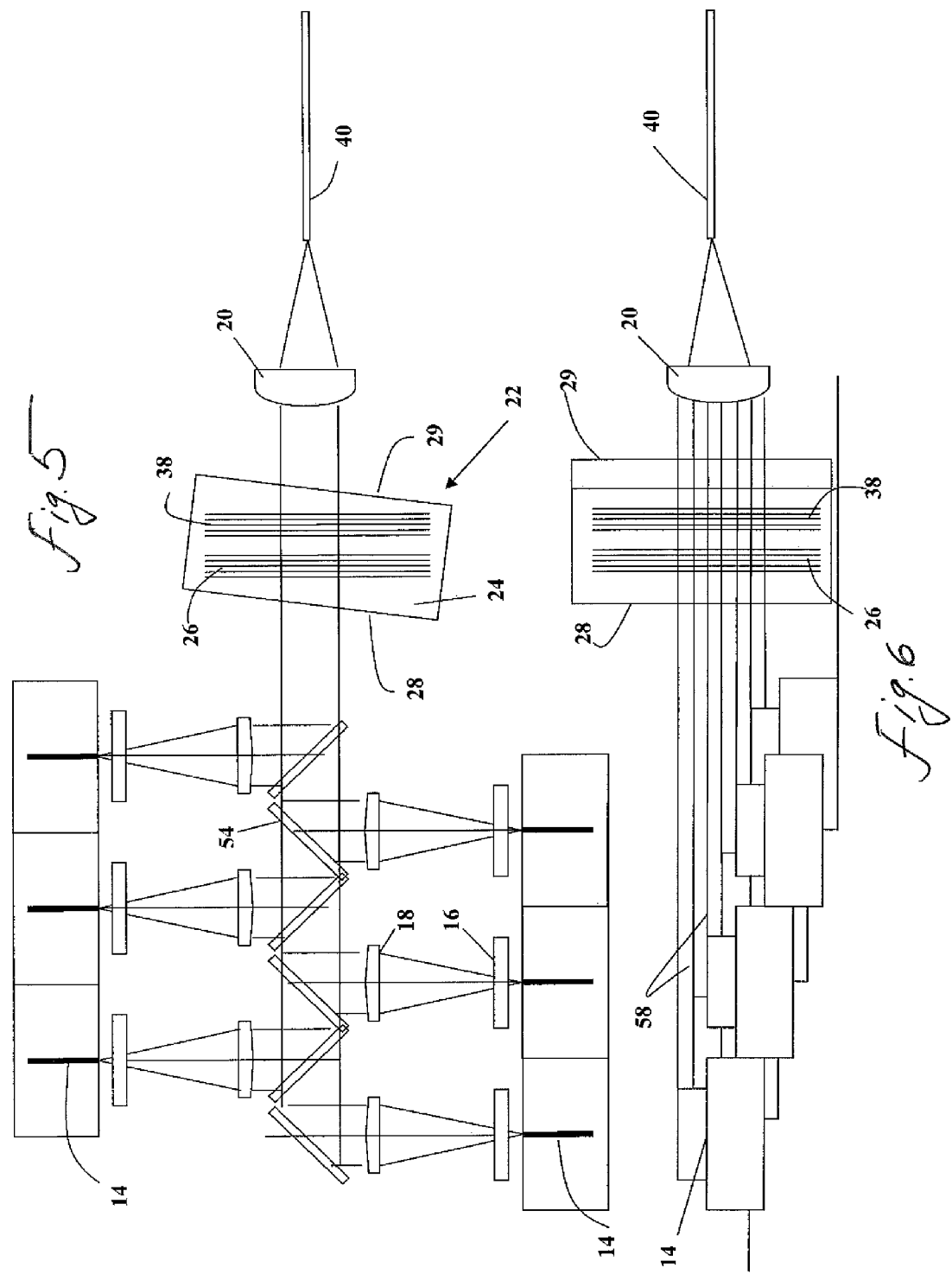

WAVELENGTH STABILIZED LIGHT EMITTER AND SYSTEM FOR PROTECTING EMITTER FROM BACKREFLECTED LIGHT

BACKGROUND OF THE DISCLOSURE

1. Field of the Disclosure

The present disclosure relates to a laser system operative to output light at stabilized wavelengths and provide emitter protection from backreflected light.

2. Prior Art Discussion

There are several types of lasers, including gas lasers, solid-state lasers, liquid (dye) lasers, free electron, and semiconductor lasers. All lasers have a laser cavity defined by an optical gain medium in the laser cavity and a method for providing optical feedback. The gain medium amplifies electromagnetic waves (light) in the cavity by stimulated emission, thereby providing optical gain.

A semiconductor active region serves as the gain medium of semiconductor lasers which are used for a variety of industrial and scientific applications. In use, semiconductor lasers are attractive for forming a source of optical energy due to, among others, a space- and wall-plug efficient configuration.

Semiconductor lasers, like the rest of optoelectronic devices, have to meet very stringent requirements. As known to one of ordinary skills in the laser arts, semiconductor lasers have the inherent problem of wavelength uncertainty of output light dependence from temperature and driving current due to the large spectral width of their gain media. In certain applications, particularly those that require high powers including, among others, material processing, military and others, such a wavelength fluctuation is highly undesirable.

One well-known means for stabilizing a wavelength involves coupling an external spectrally-selective component, such as a Bragg mirror, to a gain chip at the output facet thereof. Such a configuration is known as a Distributed Bragg Reflector (DBR) laser with a Bragg reflector mirror defining an external cavity with the input faucet of the gain chip.

FIG. 1 illustrates plots of wavelengths with and without the use of the volume Bragg mirror. As can be seen, the Bragg volume mirror narrows the emission spectrum of the chip output and conditions the chip to operate at the resonant frequency of the volume Bragg mirror above the threshold of lasing.

As light is radiated by a gain element, such as a laser diode, it impinges upon a variety of barriers including a spectrally-selective unit provided with a mirror, such as volume Bragg mirror. The spectrally-selective unit is configured with piece of photosensitive material having the Bragg mirror recorded therein in accordance with techniques disclosed in patent application publications which are assigned to PD-LD, Inc, ONPAX and others and too numerous to be individually listed here. While, the reflection of light at the resonant frequency from the Bragg mirror into the internal cavity of the laser diode is essential for a stabilized operation of the gain element, other frequencies backreflected into the internal cavity are highly undesirable. Some of the light emitted by the gain element is incident upon the photosensitive material before it hits the Bragg mirror. In the configurations of the known prior art, the material reflects a portion of chip-emitted light back into the inner cavity, thereby detrimentally affecting the operation of the gain element.

The light backreflected by material hosting a Bragg mirror, also known as chirped volume Bragg grating, is not the only light that may be backreflected back into the internal cavity. A signal light generated by a laser system, pumped by the gain element, is capable of backreflecting onto the internal cavity of the gain element as well. The ever-increasing power of gain elements, such as laser diodes, satisfying the industrial demands, is associated with powerful backreflected light signals. Typically, to prevent propagation of the laser system signals into the internal cavity of the gain element, optical isolators are placed downstream from the gain element. The isolators adequately protect the internal cavity but at the increased cost and complexity of the entire laser system.

Accordingly, what is needed is a gain element having a safeguard mechanism which is operative to prevent propagation of parasitic backreflected light generated by the gain element into the internal cavity of the gain element, without, however, rendering the entire structure cost-ineffective.

A further need exists for a configuration of laser system providing for the improved and cost-effective protection of a gain element from backreflected signal light.

SUMMARY OF THE DISCLOSURE

These needs are satisfied by the present disclosure. In particular, disclosed are a gain element module and a fiber laser system configured therewith. The module includes a solid state laser chip emitting a chip light and a wavelength-selective element providing for stabilization of the gain element's output light.

In accordance with one aspect of the disclosure, the spectrally-selective element is configured with a holographically recorded volume feedback Bragg mirror in a slab of photosensitive transparent material referred hereinbelow as a resonant Bragg mirror. However, in contrast to the known prior art, the slab has at least one of its faces, which opposes the output faucet of the laser chip, extend at an angle different from a right one with respect to the optical axis of the chip. Accordingly, when a portion of chip's output light bounces back from the slanted face of the slab before it impinges upon the VBG, a stray backreflected chip light bypasses the internal cavity of the laser chip.

In accordance with a further aspect of the disclosure, the spectrally-selective element is configured with an isolating volume Bragg mirror recorded in a slab of transparent material. The isolating volume mirror is operative to block propagation of a backreflected signal light which is generated by a laser system at a signal wavelength different from the wavelength of the chip light. At the same time, the isolating mirror is completely transparent to the chip light propagating towards the laser system.

The feedback and isolating mirrors are preferably written in a single slab of material parallel to one another. As known, the adjustment of mirrors relative to the laser chip is a time-consuming operation. However, since the disclosed volume mirrors are parallel to one another, the adjustment of the desired position of the feedback mirror automatically aligns the isolating mirror orthogonally to the signal light.

The disclosed device provides for light emitted by a gain element at the stabilized wavelength while reliably protecting the laser diode from stray light backreflected from various barriers located along the path of light.

The above and other features and advantages of the disclosure will become more readily apparent from the following specific description.

BRIEF DESCRIPTION OF THE DRAWINGS

The specific description of the disclosure will be is explained with additional specificity through the use of the accompanying drawings, in which:

FIG. 2A is a diagrammatic configuration of a two-piece spectrally selective element of the gain module of FIG. 2.

FIGS. 5 and 6 are respective side and top views of still a further embodiment of the disclosed gain module.

SPECIFIC DESCRIPTION

Figure 1:
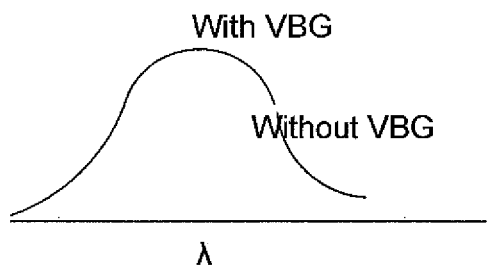
FIG. 1 illustrates the functionality of volume Bragg mirror.

Reference will now be made in detail to the disclosed module and system. Wherever possible, same or similar reference numerals are used in the drawings and the description to refer to the same or like parts or steps. The drawings are in simplified form. For purposes of convenience and clarity only, the terms "connect," "couple," and similar terms with their inflectional morphemes do not necessarily denote direct and immediate connections, but also include connections through mediate elements or devices.

The device configured in accordance with the present disclosure is operable to maintain a stabilized output, automatically align an isolating volume Bragg mirror in the desired position and protect a gain element from its broad spectrum spontaneous light and a system-generated signal light. The disclosed configuration, which is implemented in several embodiments disclosed hereinbelow, renders a cost effective, robust and reliable gain element and laser system.

Figure 2:
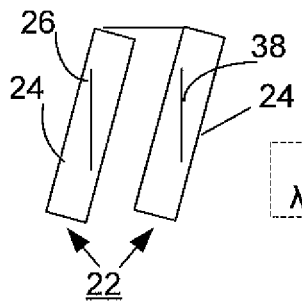
FIG. 2 is a schematic of a gain module configured in accordance with the disclosure.
Figure 2:
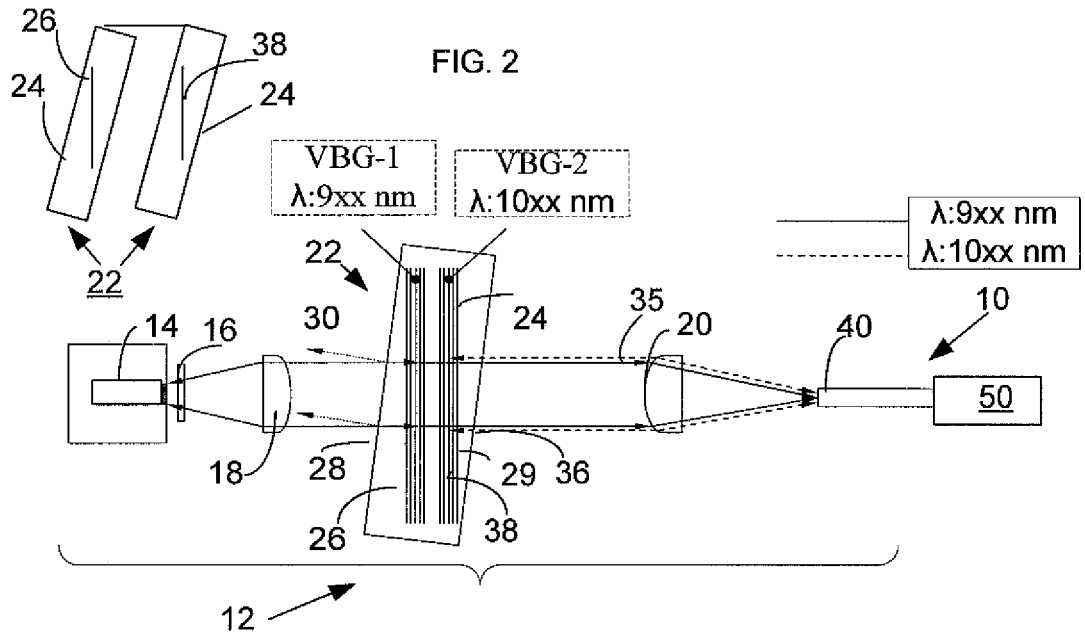

Referring to FIG. 2, a laser system 10 includes a gain module 12 configured, in accordance with one of the embodiments, with active and passive optical components or units assembled in a single housing. The gain module 12 includes a gain element 14, such as a solid state laser diode or laser chip, provided with a gain medium which emits an output light 35 along a path from its output faucet at the desired wavelength, as explained below. The module 12 further has a beam-shaping optics with a slow axis cylindrical lens 16 and fast axis lens 18. The parallel beams shaped by the beam shaping optics are collected by a coupling optics 20, such as an objective lens, operative to couple the output light into an output fiber 40 which has a downstream faucet covered with an anti-reflection coating.

The gain element 14, in response to a driving current, spontaneously emits broadband light 30 propagating along the light path. To stabilize the output of the gain element at the desired wavelength, module 12 includes a spectrally-selective element 22.

The spectrally-selective element 22 is configured to provide a wavelength-dependent sensitive feedback into the internal cavity of gain element 14 causing the latter to emit laser output light 35 at the desired wavelength. To realize it, selective element 22 is configured with at least one slab of transparent material 24 having a resonant volume Bragg mirror 26 recorded therein by, for example, a holographic method. The transparent material of slab 24 may be selected from photo-refractive crystals, inorganic photosensitive glasses or any other materials suitable for the scope of this disclosure. The gain module 12, thus, is configured with external cavity gain element 14, in which feedback Bragg mirror 26 and the input faucet of element 14 define the external cavity. The feedback Bragg mirror 26 is configured so that its Bragg resonant wavelength is different from a gain peak (central) wavelength of laser chip 14 and reflects from about 5 to about 20% of broad linewidth light 30 back into the internal cavity of the laser diode. As a result, gain element 14 radiates laser output light 35 at the resonance wavelength of feedback Bragg mirror 26 which, without any limitations, can be at 9xx nm, whereas the signal light radiated by a laser system 50 pumped by light 35 can be 10xx nm. As understood by one of ordinary skills in the laser arts, once laser chip starts radiating the laser light at the resonance wavelength, the rest of frequencies of broad spectrum light 30 is effectively suppressed.

In accordance with one aspect of the disclosure, slab of material 24 is configured to reflect a portion of broad spectrum light 30 such that it does not return into the internal cavity of laser chip 14. In particular, slab 24 is configured with an upstream face 28 extending transversely to optical axis A-A at an angle differing from a right one. As a consequence, a portion of broad spectrum light 30 is reflected from face 28 so that it bypasses the internal cavity of laser chip 14. If the reflected portion of light 30 did penetrate into gain element 14, the stabilized radiation of the chip light at the resonance wavelength of feedback mirror 26 may be compromised. The disclosed configuration of slab 24 in combination with a light absorbing coating on upstream face 28 of slab 24 and a reflective coating on the output faucet of chip 14 substantially improves the quality of the output laser signal.

In accordance with a further aspect of the disclosure, spectrally-selective element 22 is configured so as to prevent penetration of a system signal 36 (shown in dash lines in the upstream direction), radiated by laser system 50 and capable of backreflecting from a variety of obstacles, into gain element 14. The laser system 50 is configured with at least one gain block having an active fiber which is doped with one or more rare-earth elements. The backreflected light of system signal 36 may easily burn gain element 14, if not blocked.

The above-discussed means for blocking backreflected system signal 36 includes an isolating Bragg mirror 38 with a resonant frequency tuned to the wavelength of system signal 36. The isolating Bragg mirror 38 is preferably recorded in the same slab 24 as feedback mirror 26 and extends parallel thereto and, thus, perpendicular to optical axis A-A of gain element 12 in the desired position of the feedback mirror. In addition, a downstream face 29 of slab 24 is covered by an anti-reflective coating. The downstream face 29 may extend parallel to upstream face 28 and, thus, at an angle different from a right one with respect to optical axis A-A or at any other angle including the right one.

Typically, a slab with high volume Bragg mirror and the rest of element 22 are angularly (rotationally) displaceable relative to one another until the desired position in which feedback Bragg mirror 26 extends orthogonally to optical axis A-A and associated with the emission of laser light 35 at the resonance frequency. The indication of the resonance wavelength means that first, feedback Bragg mirror 26 is positioned in the desired position, i.e., orthogonally to the plane in which laser light 35 propagates, and second, isolating Bragg mirror 38 is automatically positioned orthogonally to the propagation of backreflected signal light 36 generated by system 50. However, while recording resonant and isolating mirrors 26, 38 respectively in one-piece slab 24 is preferred, the mirrors may be written in respective separate slabs of transparent material which are coupled together so as to synchronously move in response to the applied torque, as shown in FIG. 2A.

The isolating Bragg mirror 38 is located downstream from feedback mirror 26 and is transparent to the chip light and, thus, does not impede the chip light's propagation towards laser system 50. The focusing optics 20, such as an objective lens, focuses the chip light into output fiber 40. Depending on whether laser chip 14 has a single- or multi-mode configuration, output fiber 40 may be a single- or multi-mode fiber coupling chip light into laser system 50. If the laser chip is configured as a single transverse mode laser diode, gain module 12 operates as a single-frequency laser. The gain module 12 may power laser system 50 in accordance with either the side-pumping or end-pumping technique.

Figure 3:
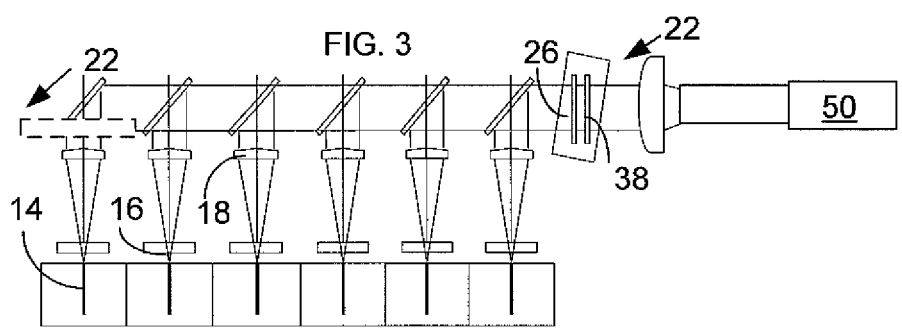
FIGS. 3 and 4 are respective side and top views of another embodiment of the disclosed gain module.
Figure 4:
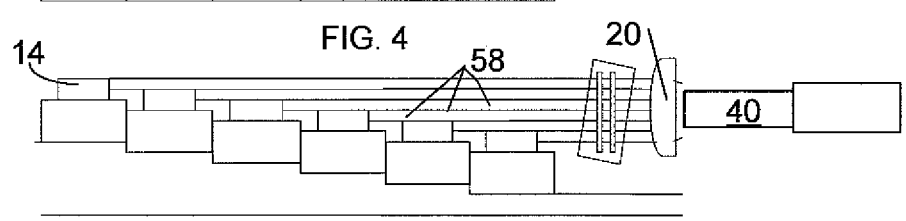

FIGS. 3 and 4 illustrate a gain module 52 with spectrally-selective element 22 as disclosed in reference to FIG. 2. The module 52 is configured with multiple gain elements or laser chips 14 each including a laser diode atop a mount. The fast- and slow-axis lenses 16 and 18, respectively, shape emitted light into parallel beams reflected by a slanted mirror 54 along a downstream stretch of optical axis between mirror 54 and output fiber 40. The successive laser chips 14 along with dedicated lenses 16, 18 and slanted mirror 54 progressively descent from the upstream laser chip to the most downstream one along the downstream stretch of the optical axis. Such a stepwise configuration allows beams 58 from respective laser chips to not interfere with one another on a way to objective lens 20.

The spectrally-selective element 22 is located immediately upstream from lens 20. In the desired position of element 22, its upstream face 28 of unit 22 and beams 58 of respective laser chips 14 constitute an angle differing from a right one so as prevent a portion of spontaneous light reflected by face 28 to propagate back into gain elements 14. The laser light from chips 14, stabilized at the resonant frequency of feedback mirror 26, is further coupled by focusing optics 20 into output fiber 40 which, in turn, delivers the stabilized chip light to laser system 50. The signal light, generated by laser system 50 and capable of partially reflecting back and burn laser chips 14, is prevented from doing so by isolating Bragg mirror 38 of unit 22. While gain module 52, as illustrated, has three laser chips 14, one of ordinary skills in the art readily understands that module 52 may include as many laser chips or gain elements as reasonable. For example, module 52 may be configured with three laser chips 14.

Alternatively, every laser chip 14 may be provided with dedicated spectrally-selective element 22 installed between fast axis lens 18 and slanted mirror 54 as diagrammatically shown by dash lines in FIG. 3. Of course, this configuration renders gain module 52 less cost- and space-effective, but more reliable. Even if one of multiple lasers chips 14 is damaged by backreflected light, the remaining laser chips may adequately provide the desired output optical power.

FIGS. 5 and 6 illustrate still a further modification of a gain module 60. A plurality of laser chips 14 are arranged in two parallel rows spaced uniformly from the axis of symmetry A-A' of gain module 60. The laser chips 14 of one row being axially offset relative to respective laser chips of the other row. The chips 14 each are coupled to a zigzag-shaped slanted mirror 54 through a combination of fast and slow-axis collimators 16 and 18, respectively. The spectrally-selective element 22 disclosed in detail above is mounted just upstream from focusing optics 20. The upstream face 28 of slab 24 extends at angle different from a right one with respect to the optical axis of the gain block and reflects chip light away from the internal cavities of respective laser chips 14. The feedback mirror 26 of element 22 stabilizes the laser light at the resonance frequency of this mirror, while isolating mirror 38 is configured to substantially totally reflect back reflected light originated downstream from focusing optics 20. Alternatively, each laser chip 14 may be provided with a dedicated spectrally-selective element 22 located upstream from mirror 54 (not shown).

The foregoing description of the disclosed embodiments has been presented for purposes of illustration. The scope of the disclosure is defined by the following claims and their equivalents.

The invention claimed is:

1. A gain module comprising:
a laser diode having spaced upstream and downstream facets defining an inner resonant cavity therebetween, the laser diode emitting broad spectrum light along a path;
a one-piece slab of transparent material downstream from the laser diode;
a feedback Bragg mirror recorded in the one-piece slab of material so as to define an external resonant cavity with the downstream facet, the feedback Bragg mirror extending in a plane perpendicular to an optical axis of the laser diode and being operative to provide a wavelength-dependent feedback into the external cavity capable of lasing an output light at a desired wavelength within the broad spectrum along the path; and
an isolating Bragg mirror recorded in the slab downstream from and parallel to the feedback minor and configured re-reflect backreflected signal light originated downstream from the slab at a wavelength different from the desired wavelength.

2. A gain module comprising:
a laser diode having upstream and downstream spaced facets defining an inner resonant cavity which is operative to emit broad spectrum light along a path;
upstream and downstream separate slabs of transparent material displaceably fixed to one another and spaced downstream from the laser diode,
a feedback Bragg mirror recorded in the upstream slab of material so as to define an external resonant cavity with the downstream facet, the feedback Bragg mirror extending in a plane perpendicular to an optical axis of the laser diode and being configured to provide the wavelength-dependent feedback into the external cavity capable of lasing light at a desired wavelength along the path, and
an isolating Bragg mirror recorded in the downstream slab and extending parallel to the feedback mirror so as to re-reflect backreflected signal light originated downstream from the downstream slab at a wavelength different from the desired wavelength.

3. The gain module of claim 1, wherein, the slab of material is configured with an upstream face extending transversely to the optical axis of the laser diode at angle different from a right angle and reflecting a portion of the broad wavelength spectrum light so that the portion bypasses the laser diode.

4. The gain module of claim 3, wherein the slab has a downstream face extending parallel to or transversely to the upstream face.

5. The gain module of claim 1 further comprising fast and slow axes collimators between the laser diode and the slab, a focusing optical component downstream from the slab, and an output fiber receiving the laser light from the focusing optical component.

6. The gain module of claim 1 further comprising a plurality of uniformly configured laser diodes arranged linearly in a stepwise manner upstream from the feedback Bragg mirror.

7. The gain module of claim 1 further comprising a plurality of uniformly configured laser diodes arranged linearly in a stepwise manner and a plurality of feedback Bragg minors, wherein the slabs each are dedicated to the laser diode.

8. The gain module of claim 1 further comprising a plurality of uniformly configured laser diodes arranged in two parallel rows which are equidistantly spaced in opposite directions from an axis of symmetry of the gain module and located, upstream from the slab which is centered on the optical axis.

9. The gain module of claim 1 further comprising a plurality of uniformly configured laser diodes arranged in two parallel rows, which are uniformly spaced in opposite directions from the optical axis of symmetry of the gain module, and a plurality of slabs each dedicated to the laser diode.

10. A fiber laser system, comprising:
- at least one laser diode having upstream and downstream facets defining an internal cavity therebetween which emits a broad spectrum light along a path;
- a slab of transparent material downstream from the laser diode,
- a feedback Bragg mirror (FBM) recorded in the slab so as to define an external resonant cavity with the downstream facet, the FBM being operative to provide an optical feedback into the external cavity so that the laser diode radiates pump light at a desired wavelength,
- an isolating Bragg mirror (IBM) recorded in the slab parallel to the FBM; and
- at least one ber gain block spaced downstream from the laser diode an operative to radiate signal light at a wavelength different from the desired wavelength, the signal light being backreflected at a signal wavelength towards the IBM, wherein the IBM is configured to re reflect the backreflected

* * * * *